Jan. 25, 1966 D. COOPER 3,231,833

SELF-STARTING TRANSISTOR OSCILLATOR CIRCUITS

Filed Sept. 30, 1963

INVENTOR.
DAVID COOPER

BY Joseph V. Claeys

HIS ATTORNEY

United States Patent Office 3,231,833

Patented Jan. 25, 1966

3,231,833

SELF-STARTING TRANSISTOR OSCILLATOR CIRCUITS

David Cooper, Erie, Pa., assignor to General Electric Company, a corporation of New York Filed Sept. 30, 1963, Ser. No. 312,404
2 Claims. (Cl. 331—113)

This invention relates to transistor oscillator circuits of the type employing a saturable magnetic core and more particularly to circuits of this type which do not require a sudden application of supply voltage for initiation of operation.

Oscillator circuits of the type employing a pair of transistor devices arranged to alternately impress a unidirectional voltage supply on first and second input windings of a saturable magnetic core to produce an alternating voltage in the output windings thereof are well known in the prior art. Such oscillator circuits utilize feedback from windings on the saturable magnetic core suitably connected between the emitter and base electrodes of the respective transistor devices whereby the respective transistors are alternately rendered conductive and nonconductive. In such circuits, initiation of operation requires a sudden surge of current tending to render one of the transistor devices conductive. Heretofore, this required that the rate of application of the supply voltage be rapid and also that a circuit unbalance condition exist to assure that the sudden application of the supply voltage was operative to render one of the transistor devices conductive. Various circuit means have been provided in the prior art for increasing the unbalance condition of the oscillator to assure initiation of operation. For example, a resistance has been employed connected in circuit with one of the transistors to increase the leakage current unbalance of the circuit assuring conductivity of that transistor upon the sudden application of the supply voltage. In other arrangements, this has been accomplished by establishing circuit transients such as by connecting a suitable capacitance in circuit with one of the transistors either in addition to or instead of the resistance. Various other arrangements may be employed, however, in all such prior art arrangements a sudden application of the supply voltage is required.

While the prior art transistor oscillators of this type are satisfactory for some applications, therefore, they are not satisfactory for those applications wherein there is no sudden application of the supply voltage but instead there is a gradual build up of voltage.

It is an object of this invention, therefore, to provide a new and improved self-starting transistor oscillator circuit of the type employing a saturable magnetic core which substantially overcomes one or more of the prior art difficulties without an undue increase in circuit complexity.

It is another object of this invention to provide transistor oscillator circuits of this type which employ a novel self-starting principle.

It is a further object of this invention to provide transistor oscillator circuits of this type which do not depend for initiation of operation upon the rate of application of the supply voltage or the establishment of circuit unbalance conditions.

It is a still further object of this invention to provide transistor oscillator circuits of this type which start reliably over a wide range of temperature conditions and voltage supply application conditions.

Briefly stated, in accordance with one aspect of this invention, the new and improved saturable magnetic core-type transistor oscillator circuit includes a starting circuit means for rendering one of the transistor devices conductive independent of the rate of application of the supply voltage. The starting circuit means comprises a starting winding placed on the core and a semiconductor switching means responsive to a predetermined supply voltage level for supplying a surge of current to the starting winding for rendering one of the transistor devices conductive.

The novel features believed characteristic of this invention are set forth with particularity in the appended claims. The invention itself, however, together with further objects and advantages thereof, may best be understood by reference to the following description taken in conjunction with the accompanying drawing in which:

Figure 1:
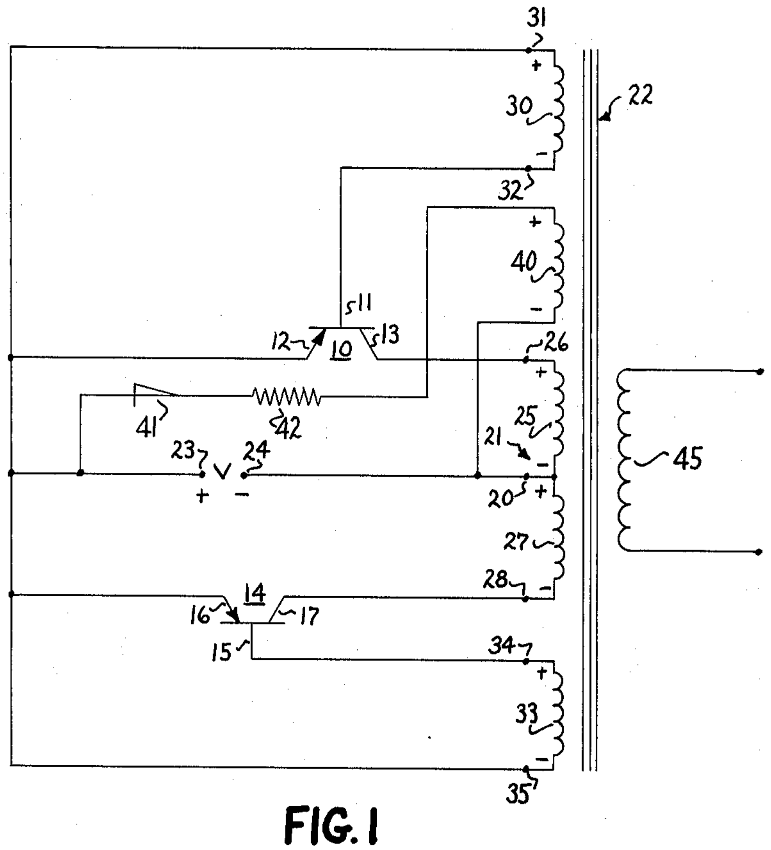
FIG. 1 is a schematic circuit diagram of one embodiment of this invention.

In FIG. 1 there is shown a schematic circuit diagram of a two transistor oscillator circuit in accordance with one embodiment of this invention. As shown, the oscillator circuit includes a first transistor 10, having a base electrode 11, an emitter electrode 12 and a collector electrode 13, and a second transistor 14, having base electrode 15, emitter electrode 16 and collector electrode 17.

Emitter electrodes 12 and 16 are connected in common to one side of a unidirectional voltage supply, shown schematically at V. The other side of the voltage supply is connected to the center tap 20 of the primary winding 21 of a saturable magnetic core, designated generally at 22. For example, for the particular PNP-type transistors shown, the positive terminal 23 of the voltage supply is connected to the emitter electrodes 12 and 16 and the negative terminal 24 of the voltage supply is connected to the center tap 20.

Saturable magnetic core 22 is provided with a primary winding 21 made up of a first input winding 25 having terminals 20 and 26 and a second input winding 27 having terminals 20 and 28. Collector electrode 13 is connected to terminal 26 of input winding 25 while collector electrode 17 is connected to terminal 28 of input winding 27. Core 22 is also provided with a feedback winding 30 having terminals 31 and 32 and a second feedback winding 33 having terminals 34 and 35. Terminal 31 of feedback winding 30 is connected to the positive voltage supply terminal 23 while terminal 32 thereof is connected to base electrode 11 of transistor 10. Similarly, terminal 35 of feedback winding 33 is connected to positive voltage supply terminal 23 while terminal 34 thereof is connected to base electrode 15 of transistor 14.

In this arrangement the sudden application of the supply voltage together with an inherent or artificially enhanced circuit unbalance condition is operative to initiate operation of the oscillator circuit in well-known manner. When there can be no sudden application of supply voltage, however, as in applications where the supply voltage builds up gradually, the existence of the circuit unbalance condition is not effective to start the circuit operating.

Starting circuit means are provided, therefore, for rendering one of the transistor devices conductive independent of the rate of application of the supply voltage. To this end, the starting circuit means comprises a starting winding disposed on the saturable magnetic core of the oscillator circuit and semiconductor switch means responsive to a predetermined supply voltage level for supplying a surge of current to the starting winding operative to render one of the transistor devices conductive. Preferably, the semiconductor switch means is a multilayer type semiconductor device having a nonlinear current-voltage characteristic, such as for example, a semiconductor controlled rectifier or a four layer, or Shockley-type, diode.

In the embodiment of this invention shown in FIG. 1, the starting circuit means, generally designated 38, comprises the series combination of a starting winding 40 disposed on core 22, a multilayer semiconductor device, such as four-layer diode 41, and a current limiting resistance 42; the series combination shunting the unidirectional voltage supply. The semiconductor four-layer diode 41, remains nonconductive until the voltage of the supply exceeds a level corresponding to the breakdown voltage thereof. When this breakdown voltage is exceeded, semiconductor device 41 abruptly conducts supplying a surface of current to starting winding 40. This surge of current in winding 40 is effective to induce voltages in feedback windings 30 and 33. As shown, the induced voltage in feedback winding 30 is in a direction to aid conduction in transistor 10 and block conduction in transistor 14.

The emitter-base barrier voltage of the transistor must be overcome before base current can flow and render the transistor conductive. Accordingly, winding 40 must be selected to assure that the voltage induced in feedback winding 30 is of a magnitude exceeding the emitter-base barrier voltage of transistor 10. Since the semiconductor device 41 requires a minimum current to remain conductive, termed the minimum holding current, resistance 42 should be selected to assure at least this minimum value. Thus, resistance 42 should be large enough to prevent excessive current flow which could damage the semiconductor device 41 while allowing at least the minimum holding current to flow.

Figure 2:
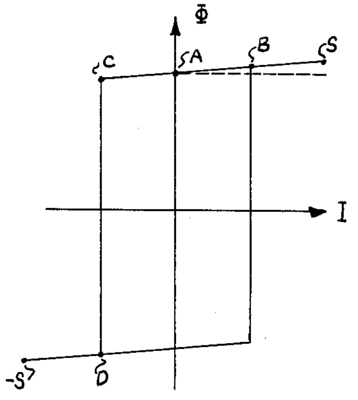
FIG. 2 is a graph illustrating the hysteresis loop of the magnetic core of the transformer employed in the oscillator circuits of this invention; and, FIG. 3 is a schematic circuit diagram of another embodiment of this invention.

The surge of current in starting winding 40 must be operative to render one of the transistor devices conductive regardless of the magnetic history of the magnetic core. For example, the circuit may be initially inoperative with both transistors 10 and 14 nonconductive but the flux in the core 22 may be at the point A of the hysteresis loop shown in FIG. 2. The surge of current in winding 40 then causes the flux in the core to move to the saturation point S. The transformer must be arranged and adapted, therefore, to assure a voltage at feedback winding 30 having a magnitude which exceeds the emitter-base barrier voltage of transistor 10 for a flux change from the point A to the point S. The transformer design criteria to accomplish this are well known in the art and will not be described in further detail herein. This may be expressed for the limiting case, for example, by the relationship $$V\left(\frac{N_3}{N_1}\right)\frac{\Delta\phi}{\Delta t}>e_1$$

where $V$=the supply voltage level
$N_3$=number of turns on feedback winding 30
$N_1$=number of turns on starting winding 40
$\Delta\phi$=flux change in core 22 from point A to point of saturation S
$\Delta t$=switching time of the semiconductor switching means plus the time for the current in winding 40 to reach a steady state value
$e_1$=the emitter-base barrier voltage of transistor 10.

Usually it will be found that when the starting winding 40 has about the same number of turns as the input winding 25 (or 27), sufficient starting energy is provided to render one of the transistor devices conductive.

Since the semiconductor switching device is turned off by transformer action, there is no permanent bias applied to the transformer by starting winding 40 once the operation of the oscillator circuit begins.

Figure 3:
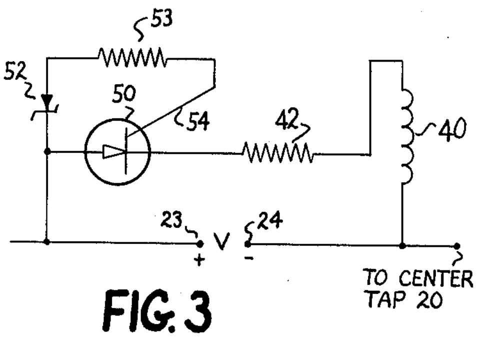

In FIG. 3 there is shown another embodiment of this invention wherein the semiconductor switching means is a semiconductor controlled rectifier 50. In this embodiment, controlled rectifier 50 is connected in series with resistance 42 and starting winding 40 providing a series combination shunting the voltage supply V. Controlled rectifier 50 is rendered conductive, to supply the required surge of current to starting winding 40 at a predetermined voltage level, by the Zener-type diode 52 in the control electrode circuit thereof. A current limiting resistance 53 assures that the control electrode rating of the controlled rectifier is not exceeded.

In operation, controlled rectifier 50 remains nonconductive until the level of the supply voltage reaches a value exceeding the breakdown voltage of the Zener-type diode 52 at which time sufficient current is supplied to the control electrode 54 of controlled rectifier 50 to render it abruptly conductive. A current surge is then supplied to starting winding 40 to render the transistor device conductive and initiate operation of the oscillator in the foregoing described manner. As previously indicated with respect to the arrangement of FIG. 1, controlled rectifier 50 is reverse biased by transformer action to render it nonconductive once the oscillator is operating.

Once the oscillator circuit has been started, it continues in operation due to the arrangement of the transistors and their relationship to feedback windings 30 and 33 in well-known manner. For example, assume that both transistors were initially nonconductive and that the voltage of the supply V has reached a level which causes a surge of current to flow in starting winding 40 to render transistor 10 conductive. Under this condition, the resistance of transistor 10 is much smaller than the resistance of nonconductive transistor 14 so that current from voltage supply V flows through input winding 25 causing magnetic flux to build up in magnetic core 22. This changing flux is effective to induce voltages in feedback windings 30 and 33 of the polarities indicated in FIG. 1. Thus, the induced voltage in winding 30 is in a direction to aid conduction in transistor 10 and block conduction in transistor 14.

The magnetic flux in core 22 increases due to the continued current from voltage supply V until the core reaches saturation. When core 22 reaches saturation there is almost no further increase in magnetic flux and, therefore, substantially no voltage is induced in feedback windings 30, and 33. Transistor 10, however, continues to conduct for a short period corresponding to the storage time thereof. Further, since the impedance of input winding 25 is very low when core 22 is in saturation, transistor 10 conducts very heavily during this short storage period thereby causing a large magnetizing force to be applied to core 22.

At the end of the storage period, transistor 10 ceases to conduct and the magnetizing force applied to the core 22 is reduced to approximately zero. This results in a change in magnetic flux in core 22 which is effective to induce voltages of opposite polarity in feedback windings 30 and 33. That is, the polarities of the voltages induced as a result of this removal of the magnetizing force is in a direction to render transistor 14 conductive and transistor 10 nonconductive. With transistor 14 conductive, current flows from the voltage supply through input winding 27 causing flux to build up in core 22 to repeat the operation described above thereby producing an alternating voltage in output winding 45.

While the invention has been set forth herein in certain preferred embodiments, many modifications and changes will occur to those skilled in the art. Accordingly, by the appended claims, I intend to cover all such modifications and changes as fall within the true spirit and scope of this invention. For example, although the improved circuit arrangement has been described in detail with respect to controlled rectifiers and four-layer type semiconductor devices, it will be apparent to those skilled in the art that other semiconductor devices or combination of semiconductor devices will be suitable for use as the semiconductor switching means responsive to the selected supply voltage level.

What is claimed as new and is desired to secure by Letters Patent of the United States is:

1. In an inverter circuit of the type wherein first and second transistor devices are arranged with a saturable core transformer having input, output and feed-back windings to alternately impress a unidirectional supply voltage across said input windings to produce an alternating current voltage in said output windings, the improvement comprising: a starting winding disposed on said saturable core; a controlled rectifier device having an anode, a cathode and a control electrode; means connecting the anode-cathode electrodes in series circuit with said starting winding across said unidirectional supply voltage; a semiconductor breakdown diode device; and means connecting said breakdown diode device in the anode-control electrode circuit of said controlled rectifier device so that said controlled rectifier is rendered conductive when the magnitude of the supply voltage exceeds the breakdown voltage level of said breakdown diode device, conduction of said controlled rectifier device allowing a surge of current to flow through said starting winding to cause voltages to be induced in said feedback windings the magnitude and direction of which initiates conduction in one of said transistor devices and blocks conduction in the other transistor device.

2. In an inverter circuit of the type wherein first and second transistor devices are arranged with a saturable core transformer having input, output and feed-back windings to alternately impress a unidirectional supply voltage across said input windings to produce an alternating current voltage in said output windings, the improvement comprising: a starting winding disposed on said saturable core; a four layer semiconductor diode device having a high and a low impedance state; means connecting said four layer semiconductor diode device in series circuit with said starting winding across said unidirectional supply voltage so that said semiconductor diode device abruptly switches from its high to its low impedance state when the voltage of said supply exceeds the breakdown voltage of said semiconductor diode device to cause a surge of current to flow through said starting winding resulting in induced voltages in said feedback windings having a magnitude and direction which is operative to initiate conduction in one of said transistor devices and block conduction in the other transistor device, said four layer semiconductor diode device being returned to its high impedance state by transformer action when said inverter circuit operates.

References Cited by the Examiner

UNITED STATES PATENTS

| | | | |
|---|---|---|---|
| 2,783,384 | 2/1957 | Bright et al. | 331—181 X |
| 2,959,744 | 11/1960 | Wengryn | 331—113 |
| 3,045,148 | 7/1962 | McNulty et al. | |
| 3,085,211 | 4/1963 | Jensen et al. | 331—113 XR |
| 3,133,204 | 5/1964 | Winchel | 307—88.5 |

ROY LAKE, *Primary Examiner.*

JOHN KOMINSKI, J. B. MULLINS, *Assistant Examiners.*